(12) United States Patent
Matsumoto et al.

(10) Patent No.: US 8,394,489 B2
(45) Date of Patent: Mar. 12, 2013

(54) HIGHLY THERMALLY CONDUCTIVE RESIN MOLDED ARTICLE

(75) Inventors: Kazuaki Matsumoto, Settsu (JP); Yasushi Kakehashi, Settsu (JP)

(73) Assignee: Kaneka Corporation, Osaka-Shi (JP)

( * ) Notice: Subject to any disclaimer, the term of this patent is extended or adjusted under 35 U.S.C. 154(b) by 41 days.

(21) Appl. No.: 12/922,686

(22) PCT Filed: Feb. 23, 2009

(86) PCT No.: PCT/JP2009/053199
§ 371 (c)(1),
(2), (4) Date: Sep. 14, 2010

(87) PCT Pub. No.: WO2009/116357
PCT Pub. Date: Sep. 24, 2009

(65) Prior Publication Data
US 2011/0027565 A1 Feb. 3, 2011

(30) Foreign Application Priority Data

Mar. 18, 2008 (JP) ................................. 2008-069797

(51) Int. Cl.
*B32B 27/00* (2006.01)
*B29C 45/00* (2006.01)
(52) U.S. Cl. ..................................... 428/220; 264/328.1
(58) Field of Classification Search .................. 428/220; 264/328.1
See application file for complete search history.

(56) References Cited

U.S. PATENT DOCUMENTS 4,879,324 A 11/1989 Lausberg et al.
(Continued)

FOREIGN PATENT DOCUMENTS

| JP | 05-051540 A | 3/1993 |
|---|---|---|
| JP | 07-278420 A | 10/1995 |
| JP | 8-283456 A | 10/1996 |
| JP | 2000-34395 A | 2/2000 |
| JP | 2000-34695 A | 2/2000 |
| JP | 2000-169680 A | 6/2000 |

(Continued)

OTHER PUBLICATIONS

Machine English Translation of JP_2008031359_A; Fujioka; Heat Radiating Chassis; Feb. 14, 2008; JPO; whole document.*

(Continued)

*Primary Examiner* — David Sample
*Assistant Examiner* — Tahseen N Khan
(74) *Attorney, Agent, or Firm* — Morrison & Foerster LLP

(57) ABSTRACT

An object of the present invention is to industrially easily mold a molded article which is excellent in thermal conductivity, electric insulation property, low density, and an injection moldability and has a thermal conduction anisotropy. The present invention relates to a highly thermally conductive resin molded article having a thermal diffusion anisotropy, the highly thermally conductive resin molded article comprising a resin composition, the resin composition containing at least resin (A) and plate-like hexagonal boron nitride powder (B) in a (A)/(B) volume ratio falling within a range of 90/10 to 30/70, the resin (A) including a thermoplastic polyester resin and/or a thermoplastic polyamide resin, the highly thermally conductive resin molded article having a thickness of not more than 1.3 mm in a part of or all over a three-dimensional shape of the highly thermally conductive resin molded article, a thermal diffusivity measured in a plane direction of the highly thermally conductive resin molded article, being (i) two or more times higher than a thermal diffusivity measured in a thickness direction of the highly thermally conductive resin molded article and (ii) not less than 0.5 mm$^2$/sec.

5 Claims, 1 Drawing Sheet

U.S. PATENT DOCUMENTS

| | | | |
|---|---|---|---|
| 5,296,550 | A | 3/1994 | Natarajan et al. |
| 5,475,058 | A | 12/1995 | Horiuchi et al. |
| 6,162,849 | A | 12/2000 | Zhuo et al. |
| 6,812,275 | B1 | 11/2004 | Tai |
| 6,831,031 | B2 | 12/2004 | Ishihara |
| 2003/0038278 | A1* | 2/2003 | Ishihara ............... 252/500 |
| 2004/0152829 | A1 | 8/2004 | Tobita et al. |
| 2005/0098916 | A1* | 5/2005 | Umetsu et al. ............. 264/122 |
| 2005/0113534 | A1 | 5/2005 | Agarwal et al. |
| 2005/0256275 | A1* | 11/2005 | Kobayashi et al. ......... 525/349 |
| 2005/0272845 | A1 | 12/2005 | Miller |
| 2006/0127422 | A1* | 6/2006 | Lodyga et al. ............ 424/400 |
| 2008/0277619 | A1 | 11/2008 | Matsumoto et al. |
| 2010/0072416 | A1 | 3/2010 | Fujioka et al. |
| 2011/0027565 | A1 | 2/2011 | Matsumoto et al. |
| 2011/0204282 | A1 | 8/2011 | Yoshihara et al. |

FOREIGN PATENT DOCUMENTS

| | | | |
|---|---|---|---|
| JP | 2002080617 A | | 3/2002 |
| JP | 2003-60134 A | | 2/2003 |
| JP | 2005-248076 A | | 9/2005 |
| JP | 2005298552 A | | 10/2005 |
| JP | 2005-336410 A | | 12/2005 |
| JP | 2008031359 A | * | 2/2008 |
| JP | 2008-270709 A | | 11/2008 |

OTHER PUBLICATIONS

International Search Report received for PCT Patent Application No. PCT/JP2009/053199, mailed on May 26, 2009, 4 pages.

International Preliminary Report on Patentability received for PCT Patent Application No. PCT/JP2009/053199, issued on Sep. 21, 2010, 11 pages (including 6 pages of English translation issued on Nov. 2, 2010).

Office Action received for Japanese Patent Application No. 2007-549168, mailed on Jun. 12, 2012, 4 pages.

Final Office Action received for U.S. Appl. No. 12/085,389, mailed on Aug. 29, 2012, 18 pages.

Advisory Action received for U.S. Appl. No. 12/085,389, mailed on Mar. 22, 2010, 8 pages.

Final Office Action received for U.S. Appl. No. 12/085,389, mailed on Nov. 17, 2009, 14 pages.

Non Final Office Action received for U.S. Appl. No. 12/085,389, mailed on Jun. 2, 2009, 11 pages.

Non Final Office Action received for U.S. Appl. No. 12/085,389, mailed on Feb. 2, 2012, 18 pages.

International Preliminary Report on Patentability (Form PCT/IB/338 and PCT/IB/373) and the Written Opinion (Form PCT/ISA/237) issued on Jun. 11, 2008, for PCT Application No. PCT/JP2006/324420, filed on Dec. 7, 2006. 4 pages (6 pages of English translation).

Pierson et al. (1996). "Handbook of Refractory Carbides and Nitrides," pp. 209-222.

"Electrical and Optical Properties of Silica," International Critical Tables of Numerical Data, Physics, Chemistry and Technology. Edited by E.W. Washburn. 1930. Knovel Online.

Advisory Action received for U.S. Appl. No. 12/085,389, mailed on Nov. 23, 2012, 6 pages.

* cited by examiner

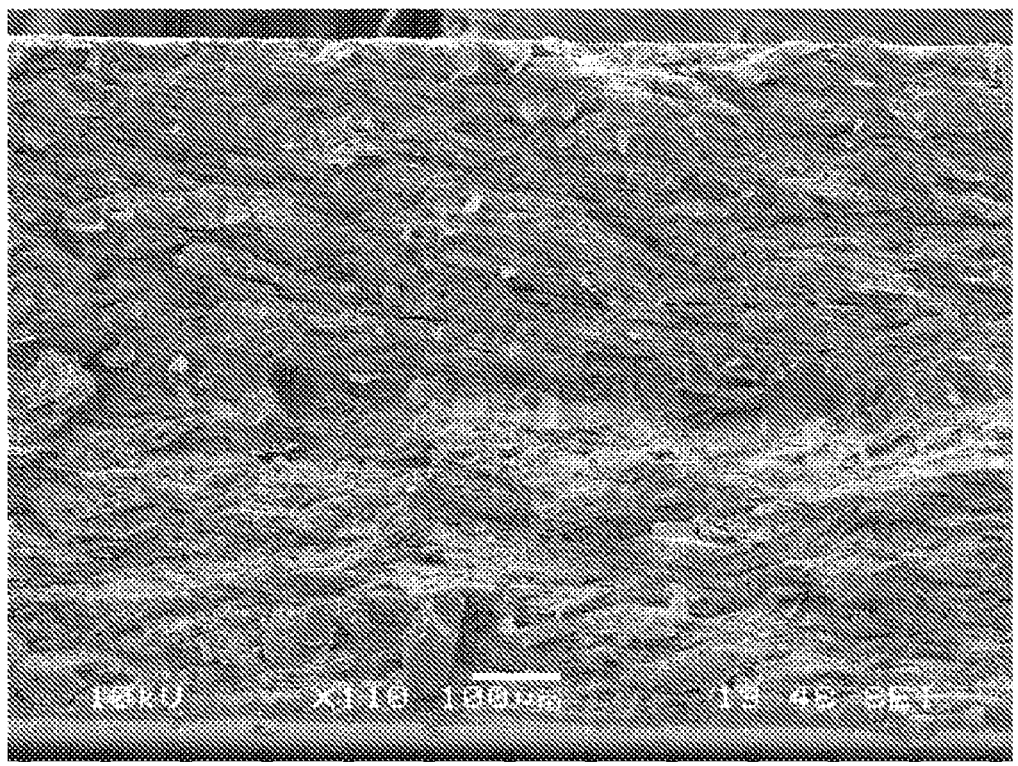

HIGHLY THERMALLY CONDUCTIVE RESIN MOLDED ARTICLE

CROSS REFERENCE TO RELATED APPLICATIONS

This is a U.S. National Phase patent application of PCT/JP2009/053199, filed Feb. 23, 2009, which claims priority to Japanese patent application Serial No. 2008-069797 filed Mar. 18, 2008, all of which are hereby incorporated by reference in the present disclosure in their entirety.

TECHNICAL FIELD

The present invention relates to a highly thermally conductive resin molded article which (i) is both highly thermally conductive and electrically insulative and (ii) has an effect of reducing heat spots produced by an electronic device because the highly thermally conductive resin molded article has a higher thermal conductivity in its plane direction than in its thickness direction. More specifically, the present invention relates to a resin molded article which can contribute to realization of a thinner and lighter portable electronic device because the resin molded article is made of a highly thermally conductive resin but is less dense and has an excellent injection moldability in thin-wall molding.

BACKGROUND ART

In a case where a thermoplastic resin composition is variously used for housings of a personal computer and a display device, an electronic device material, automotive exterior and interior parts, and the like, there sometimes occurs a problem that it is difficult to release generated heat because plastic is less thermally conductive than an inorganic substance such as a metal material. In order to solve the problem, an attempt has been extensively made to obtain a highly thermally conductive resin molded article by blending, with a thermoplastic resin, a highly thermally conductive inorganic substance in a large amount. In order to obtain the highly thermally conductive resin molded article, it is necessary to blend, with a resin, a highly thermally conductive inorganic substance such as graphite, carbon fiber, a low melting metal, alumina, or aluminum nitride normally in an amount of not less than 30% by volume and further in an amount of as many as 50% by volume.

Of these resin compositions, a resin composition in which graphite, carbon fiber, or a low melting metal is used allows obtainment of a resin molded article which is comparatively highly thermally conductive. However, the resulting resin molded article is electroconductive. As such, it is difficult to differentiate such a resin molded article from a metal, and the resin molded article has limited uses.

In contrast, a resin composition in which alumina is used can be both electrically insulative and highly thermally conductive. However, there is a problem that (i) it is difficult to meet requirements for a reduction in weight of a portable electronic device because alumina, which is more dense than a resin, gives a resulting resin composition a high density and (ii) alumina cannot make a significant improvement in thermal conductivity of the resulting resin composition. Use of aluminum nitride makes it possible to obtain a composition which has a comparatively high thermal conductivity, although, hydrolyzability of aluminum nitride and the like is a matter of concern.

Further, such a thermoplastic resin composition which is highly dense with a filler has a problem that the high filler content causes a large reduction in injection moldability, thereby making it extremely difficult to carry out injection molding of the thermoplastic resin composition with a mold which has a practical shape or a mold which has a pin gate. In order to attain a higher injection moldability of a highly thermally conductive thermoplastic resin which is highly dense with a filler, for example, Patent Literature 1 discloses a method for adding a liquid organic compound at room temperature. However, such a method has at least a problem that a mold is contaminated by a liquid organic compound which is bled out during injection molding. Various attempts for a better moldability as well as these techniques have failed to provide an effective method.

Note that, in a case where such a highly thermally conductive thermoplastic resin composition is to be used for an exterior resin of a portable electronic device, its high thermal conductivity allows heat transmission to outside directly from a part in which high heat is locally generated, for example, in a CPU provided in the portable electronic device. This would result in that the outside of the portable electronic device immediately have an extremely high temperature, which would cause a problem such as a burn on a human body when the portable electronic device is in contact with the human body.

Patent Literature 1

Japanese Patent Application Publication, Tokukai, No. 2003-41129 A (Publication Date: Feb. 13, 2003)

SUMMARY OF INVENTION

Technical Problem

The present invention has been made in view of the circumstances, and an object of the present invention is to solve a difficult challenge that, in a case where injection molding is carried out with respect to an exterior material of a portable electronic device by use of a thermoplastic resin composition which has excellent properties such as a high thermal conductivity, an electric insulation property, a low density, and a favorable injection moldability, a molded article is highly thermally conductive in its plane direction while being rather poorly thermally conductive in its thickness direction.

Solution to Problem

The inventors of the present invention diligently studied for a method for (i) satisfying all the properties of a high thermal conductivity, an electric insulation property, a low density, and an injection moldability in thin wall molding and (ii) easily providing a resulting molded article with a thermal conduction anisotropy. As a result, the inventors accomplished the present invention by finding that it is possible to easily mold an object molded article by using a resin mixed with hexagonal boron nitride powder which has a particular structure and a particular shape.

Namely, the present invention relates to:

(Statement 1) A highly thermally conductive resin molded article having a thermal diffusion anisotropy, the highly thermally conductive resin molded article including a resin composition, the resin composition containing at least resin (A) and plate-like hexagonal boron nitride powder (B) in a (A)/(B) volume ratio falling within a range of 90/10 to 30/70, the resin (A) including a thermoplastic polyester resin and/or a thermoplastic polyamide resin, the highly thermally conductive resin molded article having a thickness of not more than 1.3 mm in a part of or all over a three-dimensional shape of the highly thermally conductive resin molded article, a thermal diffusivity measured in a plane direction of the highly thermally conductive resin molded article, being (i) two or more times higher than a thermal diffusivity measured in a thickness direction of the highly thermally conductive resin molded article and (ii) not less than 0.5 mm²/sec, the highly thermally conductive resin molded article having a volume resistivity of not less than $10^{10}$ Ω·cm.

(Statement 2) The highly thermally conductive resin molded article as set forth in Statement 1, wherein the highly thermally conductive resin molded article is molded by an injection molding method.

(Statement 3) The highly thermally conductive resin molded article as set forth in Statement 1 or 2, wherein the plate-like hexagonal boron nitride powder (B) contained in the highly thermally conductive resin molded article includes agglomerated particles in a ratio of not more than 15%, the agglomerated particles being constituted by an agglomeration of a plurality of plate-like particles.

(Statement 4) The highly thermally conductive resin molded article as set forth in any one of Statements 1 through 3, wherein the plate-like hexagonal boron nitride powder (B) has a number average particle size of not less than 30 μm.

(Statement 5) The highly thermally conductive resin molded article as set forth in any one of Statements 1 through 4, wherein the plate-like hexagonal boron nitride powder (B) has a tap density of not less than 0.6 g/cm³.

(Statement 6) The highly thermally conductive resin molded article as set forth in any one of Statements 1 through 5, wherein the thermal diffusivity measured in the plane direction of the highly thermally conductive resin molded article, being (i) four or more times higher than the thermal diffusivity measured in the thickness direction of the highly thermally conductive resin molded article and (ii) not less than 0.1 mm²/sec.

(Statement 7) A method for producing a highly thermally conductive resin molded article recited in any one of Statements 1 through 6, including the step of: carrying out injection molding of the resin composition by use of a mold which is designed so that a resulting molded article has a thickness of not more than 1.3 mm in a part of or all over a three-dimensional shape of the resulting molded article.

ADVANTAGEOUS EFFECTS OF INVENTION

According to the method of the present invention, it is possible to efficiently and easily disperse, in a plane direction of a portable device, heat generated at heat spots inside the portable device. Further, since a resin itself has a high thermal conductivity, an electric insulation property, a low density, and an injection moldability in thin-wall molding, it is possible to easily mold a resin molded article which is extremely useful for realization of a thinner, lighter, and heat-resistant portable electronic device.

BRIEF DESCRIPTION OF DRAWINGS

FIG. 1
FIG. 1 is an SEM photograph of a section of a molded article of Example 9.

DESCRIPTION OF EMBODIMENTS

Examples of a thermoplastic polyester resin of a component (A) of the present invention include: (i) amorphous thermoplastic polyester resins such as amorphous aliphatic polyester, amorphous semiaromatic polyester, and amorphous wholly aromatic polyester, (ii) crystalline thermoplastic polyester resins such as crystalline aliphatic polyester, crystalline semiaromatic polyester, and crystalline wholly aromatic polyester, and (iii) liquid crystalline thermoplastic polyester resins such as liquid crystalline aliphatic polyester, liquid crystalline semiaromatic polyester, and liquid crystalline wholly aromatic polyester.

Among specific examples of the thermoplastic polyester resin, the liquid crystalline thermoplastic polyester resins preferably have include liquid crystalline polyesters composed of the following four structural units:

—O-Ph-CO— Structural unit (I)
—O—R³—O— Structural unit (II)
—O—CH₂CH₂—O— Structural unit (III)
—CO—R⁴—CO— Structural unit (IV)

(wherein R³ represents at least one group selected from the following groups:

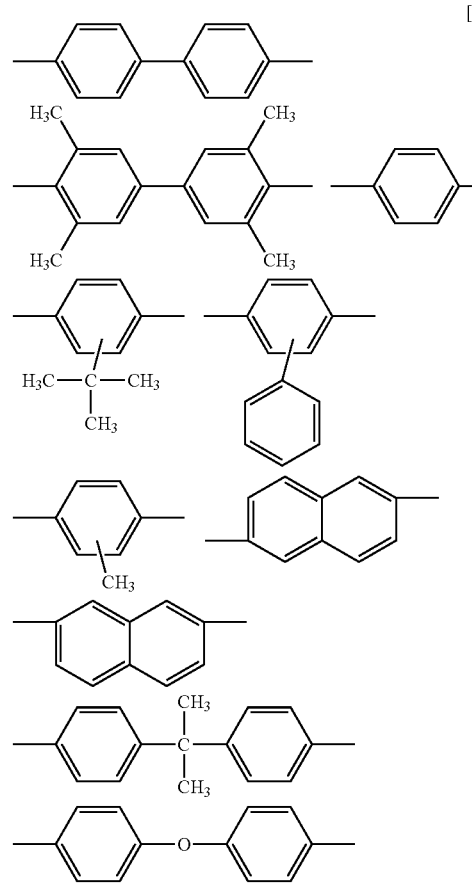

[Chem. 1]

R⁴ represents at least one group selected from the following groups:

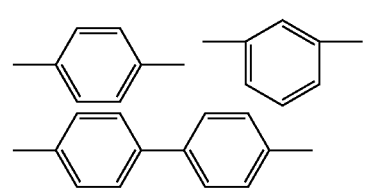

[Chem. 2]

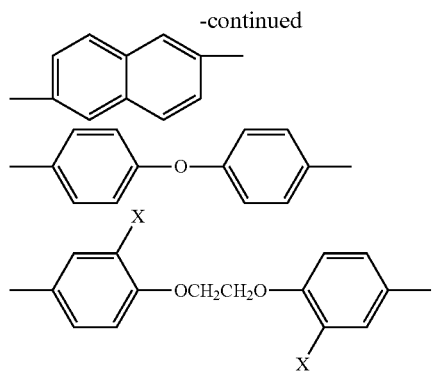

(wherein X represents a hydrogenic atom or a chlorine atom)).

The structural unit (I) represents a structural unit formed from p-hydroxybenzoic acid. The structural unit (II) represents a structural unit formed from at least one kind of aromatic dihydroxy compound selected from 4,4'-dihydroxybiphenyl, 3,3',5,5'-tetramethyl-4,4'-dihydroxybiphenyl, hydroquinone, t-butylhydroquinone, phenylhydroquinone, methylhydroquinone, 2,6-dihydroxynaphthalene, 2,7-dihydroxynaphthalene, 2,2-bis(4-hydroxyphenyl)propane, and 4,4'-dihydroxydiphenyl ether. The structural unit (III) represents a structural unit formed from ethylene glycol. The structural unit (IV) represents a structural unit formed from at least one kind of aromatic dicarboxylic acid selected from terephthalic acid, isophthalic acid, 4,4'-diphenyldicarboxylic acid, 2,6-naphthalenedicarboxylic acid, 1,2-bis(phenoxy)ethane-4,4'-dicarboxylic acid, 1,2-bis(2-chlorophenoxy)ethane-4,4'-dicarboxylic acid, and 4,4'-diphenyl ether dicarboxylic acid.

Of these liquid crystalline polyesters, (i) a liquid crystalline polyester composed of a structural unit formed from p-hydroxybenzoic acid and 6-hydroxyl-2-naphthoic acid, (ii) liquid crystalline polyesters composed of a structural unit formed from p-hydroxybenzoic acid, a structural unit formed from ethylene glycol, a structural unit formed from an aromatic dihydroxy compound, and a structural unit formed from terephthalic acid, and (iii) liquid crystalline polyesters composed of a structural unit formed from p-hydroxybenzoic acid, a structural unit formed from ethylene glycol, and a structural unit formed from terephthalic acid are particularly preferably usable.

Specific examples of a crystalline thermoplastic polyester resin of the thermoplastic polyester resins include: polyethylene terephthalate, polypropylene terephthalate, polybutylene terephthalate, polyethylene-2,6-naphthalate, polybutylene naphthalate, poly1,4-cyclohexylenedimethylene terephthalate, and polyethylene-1,2-bis(phenoxy)ethane-4, 4'-dicarboxylate, and crystalline copolymer polyesters such as polyethylene isophthalate/terephthalate, polybutylene terephthalate/isophthalate, polybutylene terephthalate/decane dicarboxylate, and polycyclohexane dimethylene terephthalate/isophthalate.

Of these crystalline polyesters, from the viewpoint of easy availability, it is preferable to use polyethylene terephthalate, polypropylene terephthalate, polybutylene terephthalate, polyethylene-2,6-naphthalate, polybutylene naphthalate, poly1,4-cyclohexylenedimethylene terephthalate, and the like. Of these crystalline polyesters, mainly from the viewpoint of an optimum crystallization rate, polyalkylene terephthalate thermoplastic polyester resins such as polyethylene terephthalate, polypropylene terephthalate, and polybutylene terephthalate are preferable.

In a thermoplastic resin composition of the present invention, the polyester resins can be used alone or in combination of two or more kinds. In a case where two or more kinds of polyester resins are used in combination, they may be used in any combinations. It is possible to combine any two or more kinds of components that are different in chemical structure, molecular weight, and/or crystalline morphology.

A thermoplastic polyamide resin of the component (A) of the present invention is a polymer which contains an amide bond (—NHCO—) in its main chain and can be melted by heat. Specific examples of the thermoplastic polyamide resin include: (i) polycaproamide (Nylon 6), polytetramethylene adipamide (Nylon 46), polyhexamethylene adipamide (Nylon 66), polyhexamethylene sebacamide (Nylon 610), polyhexamethylene dodecamide (Nylon 612), polyundecamethylene adipamide (Nylon 116), polyundecane amide (Nylon 11), polydodecane amide (Nylon 12), polytrimethylhexamethylene terephthalamide (Nylon TMHT), polytrimethylhexamethylene isophthalamide (Nylon 6I), polytrimethylhexamethylene terephthal/isophthalamide (Nylon 6T/6I), polynonamethylene terephthalamide (Nylon 9T), polybis(4-aminocyclohexyl)methane dodecamide (Nylon PACM12), polybis(3-methyl-4-aminocyclohexyl)methane dodecamide (Nylon dimethylPACM12), polymethaxylylen adipamide (Nylon MXD6), polyundecamethylene terephthalamide (Nylon 11T), polyundecamethylene hexahydro terephthalamide (Nylon 11T(H)), and copolymers and mixtures of any of these polyamides.

Of these thermoplastic polyamide resins, mainly from the viewpoint of easy availability and handleability, etc., Nylon 6, Nylon 46, Nylon 66, Nylon 11, Nylon 12, Nylon 9T, Nylon MXD6, and copolymers and mixtures of any of these polyamides are preferable. Note that (i) Nylon 6, Nylon 46, Nylon 66, and Nylon MXD6 are more preferable mainly from the viewpoint of strength, elasticity, and cost and (ii) Nylon 9T is more preferable mainly from the viewpoint of low water absorption and heat resistance.

The thermoplastic polyamide resin is not particularly limited in terms of molecular weight. Normally, a thermoplastic polyamide resin which has a relative viscosity in a range of 0.5 to 5.0 measured in concentrated sulfuric acid at 25° C. is preferably used.

The thermoplastic polyamide resin can be produced by, for example, a general polyamide polymerization method.

In the present invention, the polyamide resins can be used alone or in combination of two or more kinds. In a case where two or more kinds of polyamide resins are used in combination, they may be used in any combinations. It is possible to combine any two or more kinds of components that are different in chemical structure, molecular weight, and/or crystalline morphology.

Of these various thermoplastic polyester resins and thermoplastic polyamide resins, it is preferable to use highly crystalline or liquid crystalline resins such as a crystalline polyester resin, a liquid crystalline polyester resin, and a crystalline polyamide resin, from the viewpoint of a high thermal conductivity of a resin as simple substance. Some resins may change in crystallinity depending on molding conditions. However, in such a case, it is possible to cause an increase in thermal conductivity of a resulting resin molded article by selecting molding conditions under which a resin is highly crystalline.

Various thermoplastic resins other than the thermoplastic polyester resin and/or a thermoplastic polyamide resin (A) are additionally usable for a resin composition used in a highly thermally conductive resin molded article of the present invention. A thermoplastic resin other than (A) may be a synthetic resin or a resin found in nature. In view of a balance between moldability and mechanical characteristics, the thermoplastic resin other than (A) is used preferably in 0 part by weight to 100 parts by weight, and more preferably in 0 part by weight to 50 parts by weight, with respect to 100 parts by weight of (A).

Examples of the thermoplastic resin other than (A) include aromatic vinyl resins such as polystyrene, vinyl-cyanide resins such as polyacrylonitrile, chlorine resins such as polyvinyl chloride, polymethacrylic acid ester resins such as polymethyl methacrylate and polyacrylic acid ester resins, polyolefin resins such as polyethylene, polypropylene, and cyclic polyolefin resins, polyvinyl ester resins such as polyvinyl acetate, polyvinyl alcohol resins and derivative resins of the respective aforementioned resins, polymethacrylic acid resins and metal salt resins thereof, polyacrylic acid resins and metal salt resins thereof, poly-conjugate diene resins, polymers obtained by polymerizing maleic acid, fumaric acid, and derivatives thereof, maleimide compound polymers, polycarbonate resins, polyurethane resins, polysulphone resins, polyalkylene oxide resins, cellulosic resins, polyphenylene ether resins, polyphenylene sulfide resins, polyketone resins, polyimide resins, polyamide-imide resins, polyetherimide resins, polyether ketone resins, polyether ether ketone resins, polyvinyl ether resins, phenoxy resins, fluorine resins, silicone resins, random block graft copolymers of the respective aforementioned polymer resins exemplifying the thermoplastic resin other than (A), and etc. These thermoplastic resins other than (A) can be used alone or in combination of two or more kinds. In a case where two or more kinds of polyester resin are used in combination, it is possible to add thereto a compatibilizing agent or the like if necessary. According to why it is added, a thermoplastic resin other than (A) to add can be selected as appropriate.

Of these thermoplastic resins other than (A), a thermoplastic resin which is partially or entirely crystalline or liquid crystalline is preferable from the viewpoint that (i) a resulting resin composition is likely to have a high thermal conductivity and (ii) it is easy to cause a resin to contain an inorganic compound (B). Such a crystalline or liquid crystalline thermoplastic resin may be entirely crystalline. Alternatively, the crystalline or liquid crystalline thermoplastic resin may be partially crystalline (e.g., only a given block of molecules of a block or graft copolymer resin may be crystalline or liquid crystalline). Crystallinity of such a resin is not particularly limited. Note that a polymer alloy of an amorphous resin and a crystalline or liquid crystalline resin is usable as a thermoplastic resin other than (A). Crystallinity of such a resin is not particularly limited.

Some partially or entirely crystalline or liquid crystalline thermoplastic resins other than (A) are amorphous in some cases where they are used alone and/or subjected to molding under given molding processing conditions, though they can be crystallized. In a case where such a resin is used, it may be possible to partially or entirely crystallize the resin by devising a molding processing method (e.g., (i) adjusting a used amount and an addition method of the inorganic compound (B) and (ii) carrying out a stretching process and/or a post-crystallization treatment with respect to the resin).

Of these partially or entirely crystalline or liquid crystalline thermoplastic resins, a polyphenylene sulfide resin, a crystalline polyolefin resin, and a polyolefin block copolymer are preferable. A crystalline or liquid crystalline thermoplastic resin is not limited to these, and various kinds of crystalline resins and liquid crystalline resins are usable.

Note that use of an elastic resin in the thermoplastic resin other than (A) can bring about an improvement in shock strength of the resin (A). Given that such an elastic resin has an excellent shock strength improving effect on a resulting resin composition, at least one glass transition point of the elastic resin has a temperature preferably of not more than 0° C., and more preferably of not more than −20° C.

Such an elastic resin is not particularly limited. Examples of the elastic resin include: diene rubbers such as polybutadiene, styrene-butadiene rubber, acrylonitrile-butadiene rubber, and (meth)acrylic acid alkyl ester-butadiene rubber; rubbery polymers such as acrylic rubber, ethylene-propylene rubber, and siloxane rubber; rubbery copolymers obtained by polymerizing (i) 10 parts by weight to 90 parts by weight of at least one monomer selected from the group consisting of an aromatic vinyl compound, a vinyl-cyanide compound, and (meth)acrylic acid alkyl ester and (ii) not more than 10 parts by weight of another vinyl compound which can be copolymerized with the at least one monomer, with respect to 10 parts by weight to 90 parts by weight of a diene rubber and/or a rubbery polymer; polyolefin resins such as polyethylene and polypropylene; ethylene-alpha olefin copolymers such as an ethylene-propylene copolymer and an ethylene-butene copolymer; olefin copolymers such as a propylene-butene copolymer; modified copolymer polyolefin resins modified by various copolymer components such as an ethylene-ethyl acrylate copolymer; modified polyolefin resins modified by various functional components such as an ethylene-glycidyl methacrylate copolymer, an ethylene-maleic anhydride copolymer, an ethylene-propylene-glycidyl methacrylate copolymer, an ethylene-propylene-maleic anhydride copolymer, an ethylene-butene-glycidyl methacrylate copolymer, an ethylene-butene-maleic anhydride copolymer, a propylene-butene-glycidyl methacrylate copolymer, and a propylene-butene-maleic anhydride copolymer; and styrene thermoplastic elastomers such as a styrene-ethylene-propylene copolymer, a styrene-ethylene-butene copolymer, and a styrene-isobutylene copolymer.

In a case where an elastic resin is added, the elastic resin is used normally in not more than 150 parts by weight, preferably in a range of 0.1 part by weight to 100 parts by weight, and more preferably in a range of 0.2 part by weight to 50 parts by weight, with respect to 100 parts by weight of the resin (A) in total. When the elastic resin is used in more than 150 parts by weight, a deterioration mainly in stiffness, heat resistance, and thermal conductivity is likely to occur in the resin (A).

It is possible to produce, by various publicly-known methods, plate-like hexagonal boron nitride powder (the inorganic compound) (B) which is used in the present invention and has a number average particle size of not less than 15 μm. One example of a general production method is as follows. (i) A boron source such as boric oxide or boric acid and (ii) a nitrogen source such as melamine, urea, or ammonia are preliminary reacted with each other according to need. Then, the reaction product is heated at approximately 1000° C. in the presence of an inert gas such as nitrogen or under a vacuum, thereby to synthesize turbostratic boron nitride. Thereafter, the turbostratic boron nitride is further heated to approximately 2000° C. in the presence of an inert gas such as nitrogen or argon or under a vacuum, thereby to promote crystallization. As a result, hexagonal boron nitride powder can be obtained. According to such a production method, it is possible to obtain plate-like hexagonal boron nitride powder which generally has a number average particle size of approximately 5 μm to 15 μm. In contrast, the plate-like hexagonal boron nitride powder used in the present invention is set to have a number average particle size of not less than 15 µm by causing a primary crystal to be large in size by use of a special production method.

One example of a method for obtaining the plate-like hexagonal boron nitride powder the component (B) which has a number average particle size of not less than 15 µm is as follows. (i) A compound serving as a nitrogen source such as melamine or urea or a gas serving as a nitrogen source such as nitrogen gas or ammonia gas and (ii) a compound serving as a boron source such as boric oxide or boric acid are sintered at a high temperature of approximately 1700° C. to 2200° C. in an atmosphere of an inert gas such as nitrogen or argon in the presence of a flux compound which liquefies at a high temperature such as lithium nitrate, calcium carbonate, sodium carbonate, or metal silicon, thereby to promote crystalline growth in the flux compound so as to obtain crystal particles which have a large particle size. A production method is not limited to such a method, and various methods can be employed.

A resin composition obtained by filling a resin with the plate-like hexagonal boron nitride powder (B) thus obtained which has an especially large number average particle size is subjected to injection molding so that a molded article has a thickness of not more than 1.3 mm in a part of or all over a three-dimensional shape of the molded article, thereby to orient, in a plane direction of the molded article, most of the plate-like hexagonal boron nitride powder with which the resin is filled. Since the plate-like hexagonal boron nitride powder is oriented in such a manner, a thermal diffusivity measured in a plane direction of the molded article having a thickness of not more than 1.3 mm can be two or more times higher than a thermal diffusivity measured in a thickness direction of the molded article. As compared to boron nitride which has a small number average particle size, the plate-like hexagonal boron nitride powder (B) which has a number average particle size of not less than 15 µm has properties of being more likely to transmit heat in a plane direction of its plate-like shape and (ii) having the plate-like shape which is more likely to be oriented in a plane direction of a molded article when the plate-like hexagonal boron nitride powder (B) is subjected to injection molding in a mold for thin-wall molding.

It is necessary that plate-like hexagonal boron nitride powder (B) have a number average particle size of not less than 15 µm, preferably of not less than 20 µm, more preferably of not less than 25 µm, still more preferably of not less than 30 µm, and most preferably of not less than 40 µm. This is because a larger number average particle size causes an increase in thermal conduction anisotropy obtained when the plate-like hexagonal boron nitride powder (B) is formed into molded article. An upper limit of the number average particle size of the plate-like hexagonal boron nitride powder (B) is generally not more than 1 mm. In the case of the plate-like hexagonal boron nitride powder (B) which has a number average particle size of not less than 1 mm, there is likely to occur a deterioration in moldability partly because the plate-like hexagonal boron nitride powder (B) clogs a gate portion of a mold during injection molding.

In addition, in a case where a ratio of agglomerated particles each being constituted by an agglomeration of a plurality of plate-like particles to the plate-like hexagonal boron nitride powder (B) contained in a highly thermally conductive resin molded article is not more than 15%, the plate-like hexagonal boron nitride powder (B) of the highly thermally conductive resin molded article has a better orientation property and the highly thermally conductive resin molded article can have a higher thermal conductivity in its plane direction than in its thickness direction. A ratio of agglomerated particles to plate-like hexagonal boron nitride powder (B) (an agglomerated particle ratio) is preferably not more than 12%, more preferably not more than 10%, and most preferably not more than 8%.

The number average particle size and the agglomerated particle ratio of the plate-like hexagonal boron nitride powder (B) can be found by observing at least not less than 100 pieces, preferably not less than 1000 pieces of the plate-like hexagonal boron nitride powder (B) by use of a scanning electron microscope and thereafter, by use of a captured photograph, measuring a particle size of the plate-like hexagonal boron nitride powder (B) and checking whether or not there exists an agglomeration.

A ratio in which agglomerated particles are contained in the highly thermally conductive resin molded article (an agglomerated particle ratio) can be found by leaving the highly thermally conductive resin molded article as it is in, for example, an electric furnace at a temperature of not less than 550° C. but not more than 2000° C., preferably at not less than 600° C. but not more than 1000° C. for not less than 30 minutes but not more than 5 hours so as to remove the resin component by combustion from the highly thermally conductive resin molded article, thereafter observing the remaining plate-like hexagonal boron nitride powder by use of a scanning electron microscope. Even if the plate-like hexagonal boron nitride powder slightly agglomerates when it is blended with the resin, the agglomeration of the plate-like hexagonal boron nitride powder is crushed when an intense shearing force is applied to the resin composition during melt-kneading or molding. As a result, the agglomerated particle ratio may be reduced in the highly thermally conductive resin molded article. As such, the agglomerated particle ratio is measured by use of fine particles extracted from the highly thermally conductive resin molded article. Note, however, that, in a case where an inorganic component other than the resin and the plate-like hexagonal boron nitride powder is added to the highly thermally conductive resin molded article, the inorganic component other than boron nitride is melted at a high temperature, so that plate-like hexagonal boron nitride may be agglomerated. In this case, it is possible to measure the agglomerated particle ratio, without changing a state of the agglomeration of the plate-like hexagonal boron nitride powder, by selecting a temperature at which the inorganic component other than boron nitride (i) is not melted or (ii) is decomposed to be volatilized.

The number of agglomerated particles is found by counting the number of primary particles which have not been agglomerated with respect to the total number of the primary particles. Namely, in a case where there exist 100 primary particles and 50 of the primary particles are agglomerated in a mass while the remaining 50 of the primary particles have not been agglomerated, a ratio of the agglomerated particles to the primary particles is 50%.

Note here that a particle size is found by use of a diameter of a circle in a case where a plate-like particle is circular when the plate-like particle is observed so as to have the largest projected area. Note also that, in a case where the plate-like particle is not circular, a longest length in a surface of the plate-like particle is referred to as a particle size. Namely, in a case where the plate-like particle is elliptical, a major axis is referred to as a particle size. In a case where the plate-like particle is rectangular, a length of a diagonal line of the rectangle is referred to as a particle size.

A plate-like shape of particles is defined by a state in which a major axis of the particles obtained when the powder is observed so as to have the largest projected area is (i) not less than 5 times longer than the shortest side of the particle obtained when the particle is observed so as to have the smallest projected area and (ii) less than 5 times longer than a minor axis of the particle obtained when the particle is observed so as to have the largest projected area. The major axis of the particle obtained when the particle is observed so as to have the largest projected area is preferably not less than 6 times, and more preferably not less than 7 times longer than the shortest side of the particle obtained when the particle is observed so as to have the smallest projected area. When the particle is observed so as to have the largest projected area, its major axis is preferably less than 4.5 times, and more preferably less than 4 times longer than its minor axis.

A tap density of the plate-like hexagonal boron nitride powder (B) is found by the following method using a general powder tap density measuring device. The plate-like hexagonal boron nitride powder is contained in a density measuring container of 100 cc and tapped to be dense therein by impacts caused by the tapping. Thereafter, surplus powder remaining in an upper part of the density measuring container is leveled off with a blade. The plate-like hexagonal boron nitride powder with a greater tap density thus measured is easier to fill the resin with the plate-like hexagonal boron nitride powder. The plate-like hexagonal boron nitride powder has a tap density preferably of not less than 0.6 g/cm$^3$, more preferably of not less than 0.65 g/cm$^3$, still more preferably of not less than 0.7 g/cm$^3$, and most preferably of not less than 0.75 g/cm$^3$.

A thermoplastic resin composition constituting the highly thermally conductive resin molded article of the present invention preferably contains the resin (A) and the plate-like hexagonal boron nitride powder (B) in a (A)/(B) volume ratio falling within a range of 90/10 to 30/70. The (A)/(B) volume ratio is preferably 85/15 to 33/67, more preferably 80/20 to 35/65, still more preferably 75/25 to 40/60, and most preferably 70/30 to 45/55, from the viewpoint that (i) use of a larger amount of (A) tends to cause an improvement in shock resistance, surface property, and molding workability of a resulting molded article and to facilitate blending of (B) into the resin during melt-kneading and (ii) a larger amount of (B) is preferable because it tends to cause an increase in thermal conductivity.

In order to provide the highly thermally conductive resin molded article of the present invention with a higher performance, it is possible to use, in combination, a highly thermally conductive inorganic compound which has a thermal conductivity of not less than 10 W/m·K in pure form. In order to cause the highly thermally conductive resin molded article to have a higher thermal conductivity, a highly thermally conductive inorganic compound which has a thermal conductivity preferably of not less than 12 W/m·K, more preferably of not less than 15 W/m·K, most preferably of not less than 20 W/m·K, and particularly preferably of not less than 30 W/m·K in pure form is used. An upper limit of the thermal conductivity of the highly thermally conductive inorganic compound in pure form is not particularly limited. It is more preferable that the highly thermally conductive inorganic compound have a thermal conductivity as high as possible in pure form. A highly thermally conductive inorganic compound which has a thermal conductivity preferably of not more than 3000 W/m·K, and more preferably of not more than 2500 W/m·K in pure form is generally used.

Particularly in a case where a highly thermally conductive inorganic compound is used for an application in which a sophisticated electric insulation property is required as a molded article, a compound which has an electric insulation property is preferably used. Note that having an electric insulation property means having an electric resistance of not less than 1 Ω·cm. It is advantageous to use a compound which has an electric resistance preferably of not less than 10 Ω·cm, more preferably of not less than $10^5$ Ω·cm, still more preferably of not less than $10^{10}$ Ω·cm, and most preferably of not less than $10^{13}$ Ω·cm. An upper limit of the electric resistance is not particularly limited. A compound which has an electric resistance of not more than $10^{18}$ Ω·cm is generally used. It is preferable that the highly thermally conductive resin molded article of the present invention have an electric insulation property falling within the foregoing range.

Of the highly thermally conductive inorganic compounds, specific examples of the compound which has an electric insulation property include: metal oxides such as aluminum oxide, magnesium oxide, silicon oxide, beryllium oxide, copper oxide, and cuprous oxide; metal nitrides such as aluminum nitride and silicon nitride; metal carbides such as silicon carbide; metal carbonates such as magnesium carbonate; insulative carbon materials such as diamond; metal hydroxides such as aluminum hydroxide and magnesium hydroxide; and boron nitrides which have morphologies different from the morphology of (B) such as cubic boron nitride and turbostratic boron nitride. Note that aluminum oxide can be a complex compound of, e.g., aluminum oxide and another element such as mullite.

In particular, boron nitrides other than (B); metal nitrides such as aluminum nitride and silicon nitride; metal oxides such as aluminum oxide, magnesium oxide, and beryllium oxide; metal carbonates such as magnesium carbonate, metal hydroxides such as aluminum hydroxide and magnesium hydroxide; and insulative carbon materials such as diamond are more preferably usable because they have excellent insulation properties. Of aluminum oxides, α-alumina is preferable due to its excellent thermal conductivity. These compounds can be used alone or in combination of two or more kinds.

These highly thermally conductive inorganic compounds can have various shapes. Examples of the various shapes include: particles, fine particles, nanoparticles, agglomerated particles, a tubular shape, a nanotubular shape, a wire shape, a rod shape, a needle shape, a plate shape, an amorphous shape, a rugby ball shape, a hexahedral shape, complex particles in which large particles and fine particles are mixed with each other, and a liquid. Note that these highly thermally conductive inorganic compounds may be natural products or synthetic products. In the case of natural products, at least where they are produced is not particularly limited and they can be appropriately selected. These highly thermally conductive inorganic compounds can be used alone or in combination of two or more kinds which are different in shape, average particle size, kind, surface treatment agent, and the like.

These highly thermally conductive inorganic compounds, which cause an increase in adhesiveness at an interface between a resin and an inorganic compound and facilitate workability, can be subjected to a surface treatment in which various surface treatment agents such as a silane treatment agent are used. A surface treatment agent is not particularly limited, and conventionally publicly-known surface treatment agents such as a silane coupling agent and a titanate coupling agent are usable. In particular, a silane coupling agent containing a epoxy group such as epoxy silane, a silane coupling agent containing an amino group such as aminosilane, and a polyoxyethylene coupling agent are preferable because they are less likely to cause a deterioration in properties of a resin. A method for carrying out a surface treatment with respect to an inorganic compound is not particularly limited, and a general surface treatment method can be employed.

In order to cause a further increase in heat resistance and mechanical strength of a resin composition used in the highly thermally conductive resin molded article of the present invention, it is possible to further add an inorganic compound other than the highly thermally conductive inorganic compound within the scope of the feature of the present invention. Such an inorganic compound is not particularly limited. However, addition of such an inorganic compound may have an influence on a thermal conductivity of the highly thermally conductive resin molded article. It is therefore necessary to be careful of, for example, an amount of such an inorganic compound to be added. Such an inorganic compound may also be subjected to a surface treatment. In a case where such an inorganic compound is used, it is preferable that the inorganic compound be added in not more than 100 parts by weight with respect to 100 parts by weight of the resin (A). The addition of the inorganic compound in more than 100 parts by weight may cause a deterioration in shock resistance and molding workability. The inorganic compound is added preferably in not more than 50 parts by weight, and more preferably in not more than 10 parts by weight. Note that addition of a larger amount of such an inorganic compound is likely to cause a deterioration in surface property and dimensional stability of the highly thermally conductive resin molded article. Therefore, in a case where such properties are considered as important, it is preferable to minimize an amount of the inorganic compound to be added.

In order to provide the highly thermally conductive resin molded article of the present invention with a higher performance, it is preferable that thermostabilizers such as a phenolic stabilizer, a sulfur stabilizer, and a phosphorus stabilizer be added alone or in combination of two or more kinds. Further, according to need, a stabilizer, a lubricant, a release agent, a plasticizer, a flame retarder except a phosphorous flame retarder, an auxiliary flame retarder, an ultraviolet absorber, a light stabilizer, a pigment, a dye, an antistatic agent, an electric conductivity-imparting agent, a dispersant, a compatibilizing agent, and an antimicrobial agent, each of which is generally well-known, can be added alone or in combination of two or more kinds.

A method for producing a resin composition used in the highly thermally conductive resin molded article of the present invention is not particularly limited. For example, the resin composition can be produced as follows. Components, an additive, and/or the like mentioned above are dried, so as to be subjected to melt-kneading by use of a melt-kneading machine such as a single screw extruder or a double screw extruder. Note that, in a case where a blended component is a liquid, it is also possible to produce the resin composition by adding, in the middle of the melt-kneading, the liquid into the melt-kneading machine by use of a liquid supply pump or the like.

In a resin composition used in the thermally conductive resin molded article of the present invention, it is possible to cause a further increase in moldability by adding a crystallization accelerator such as a nucleating agent according to need.

Examples of the crystallization accelerator used in the present invention include: a higher fatty acid amide, an urea derivative, a sorbitol compound, a higher fatty acid salt, and an aromatic fatty acid salt. These crystallization accelerators can be used alone or in combination of two or more kinds. In particular, a higher fatty acid amide, an urea derivative, and a sorbitol compound are preferable because they are highly effective as crystallization accelerators.

Examples of the higher fatty acid amide include: behenic amide, oleic amide, erucic amide, stearic amide, palmitic amide, N-stearyl behenic amide, N-stearyl erucic amide, ethylenebis stearic amide, ethylenebis oleic amide, ethylenebis erucic amide, ethylenebis lauric amide, ethylenebis capric amide, p-phenylenebis stearic amide, and a polycondensate of ethylene diamine, stearic acid, and sebacic acid. In particular, behenic amide is preferable.

Examples of the urea derivative include: bis(stearylureido)hexane, 4,4'-bis(3-methylureido)diphenylmethane, 4,4'-bis(3-cyclohexylureido)diphenylmethane, 4,4'-bis(3-cyclohexylureido)dicyclohexylmethane, 4,4'-bis(3-phenylureido)dicyclohexylmethane, bis(3-methylcyclohexylureido)hexane, 4,4'-bis(3-decylureido)diphenylmethane, N-octyl-N'-phenylurea, N,N'-diphenylurea, N-tolyl-N'-cyclohexylurea, N,N'-dicyclohexylurea, N-phenyl-N'-tribromophenylurea, N-phenyl-N'-tolylurea, and N-cyclohexyl-N'-phenylurea. In particular, bis(stearylureido)hexane is preferable.

Examples of the sorbitol compound include: 1,3,2,4-di(p-methylbenzylidene)sorbitol, 1,3,2,4-dibenzylidenesorbitol, 1,3-benzylidene-2,4-p-methylbenzylidenesorbitol, 1,3-benzylidene-2,4-p-ethylbenzylidenesorbitol, 1,3-p-methylbenzylidene-2,4-benzylidenesorbitol, 1,3-p-ethylbenzylidene-2,4-benzylidenesorbitol, 1,3-p-methylbenzylidene-2,4-p-ethylbenzylidenesorbitol, 1,3-p-ethylbenzylidene-2,4-p-methylbenzylidenesorbitol, 1,3,2,4-di(p-ethylbenzylidene)sorbitol, 1,3,2,4-di(p-n-propylbenzylidene)sorbitol, 1,3,2,4-di(p-i-propylbenzylidene)sorbitol, 1,3,2,4-di(p-n-butylbenzylidene)sorbitol, 1,3,2,4-di(p-s-butylbenzylidene)sorbitol, 1,3,2,4-di(p-t-butylbenzylidene)sorbitol, 1,3,2,4-di(p-methoxybenzylidene)sorbitol, 1,3,2,4-di(p-ethoxybenzylidene)sorbitol, 1,3-benzylidene-2,4-p-chlorobenzylidenesorbitol, 1,3-p-chlorobenzylidene-2,4-benzylidenesorbitol, 1,3-p-chlorobenzylidene-2,4-p-methylbenzylidenesorbitol, 1,3-p-chlorobenzylidene-2,4-p-ethylbenzylidenesorbitol, 1,3-p-methylbenzylidene-2,4-p-chlorobenzylidenesorbitol, 1,3-p-ethylbenzylidene-2,4-p-chlorobenzylidenesorbitol, and 1,3,2,4-di(p-chlorobenzylidene)sorbitol. Of these sorbitol compounds, 1,3,2,4-di(p-methylbenzylidene)sorbitol and 1,3,2,4-dibenzylidenesorbitol are preferable.

In a case where a crystallization accelerator is added to the highly thermally conductive resin molded article of the present invention, from the viewpoint of moldability, the crystallization accelerator is used preferably in not less than 0.01 part by weight, more preferably in not less than 0.03 parts by weight, and still more preferably not less than 0.05 part by weight, with respect to 100 parts by weight of the resin the component (A). When used in less than 0.01 part by weight, the crystallization accelerator may have an insufficient effect as a crystallization accelerator. In contrast, an upper limit of the amount of the crystallization accelerator to be used is preferably not more than 5 parts by weight, more preferably not more than 4 parts by weight, particularly preferably not more than 3 parts by weight, and most preferably not more than 1 part by weight. When used in more than 5 parts by weight, the crystallization accelerator may have a saturation effect. This is economically not preferable and further may cause a deterioration in appearance and properties of the highly thermally conductive resin molded article. Normally, in a resin composition in which a highly thermally conductive filler other than plate-like hexagonal boron nitride powder is used, in a case where the resin composition is filled with a larger amount of the filler so that the resin composition has a higher thermal conductivity, its moldability is significantly deteriorated, and a large amount of the crystallization accelerator is therefore likely to be necessary. According to the present invention, even if the crystallization accelerator is added in an amount of as small as not more than 5 parts by weight, it is possible to realize both a high thermal conductivity and a favorable moldability by use of a thermoplastic polyester resin and/or a thermoplastic polyamide resin and plate-like hexagonal boron nitride powder in combination.

It is necessary that the highly thermally conductive resin molded article of the present invention be a molded article which is molded so that a part or all over a three-dimensional shape of the molded article has a thickness of not more than 1.3 mm. Since the molded article is molded so as to have a thickness of not more than 1.3 mm in a wide area thereof, the plate-like hexagonal boron nitride powder has a better orientation property and a difference in thermal diffusivity between a plane direction and a thickness direction of the molded article becomes large. This can easily provide the molded article with a thermal diffusion anisotropy and can also contribute to realization of a thinner and lighter portable device. A ratio of a part of the molded article which part has a thickness of not more than 1.3 mm to the other part of the molded article can be appropriately set in consideration of a strength and a design property of the molded article. The molded article is molded so that preferably not less than 50%, more preferably not less than 55%, still more preferably not less than 60%, and most preferably not less than 70% of the molded article has a thickness of not more than 1.3 mm. Note that preferably not less than 50% of the molded article has a thickness preferably of not more than 1.28 mm, more preferably of not more than 1.2 mm, still more preferably of not more than 1.1 mm, and most preferably of not more than 1.0 mm. On the other hand, in a case where the molded article has a too small thickness, it may be difficult to carry out a mold process and the molded article may be vulnerable to shock. A minimum thickness of the molded article is preferably not less than 0.5 mm, more preferably not less than 0.55 mm, and most preferably not less than 0.6 mm. Note that the molded article can have an entirely uniform thickness or partially have a thick part and a thin part.

Thermal diffusivity anisotropies in a plane direction and in a thickness direction of the molded article which has a thickness of not more than 1.3 mm are found, by use of a flash thermal diffusivity measuring device, by a method in which a sample which has a plane shape is heated from the direction of a top surface thereof with laser or light and changes in temperature increase are measured on (i) a rear surface of a heated part and (ii) a rear surface of a part which is slightly away from the heated part in the plane direction. In order to suppress an increase in surface temperature of the sample during the measurement, it is preferable to use a xenon flash thermal diffusivity measuring device for the measurement. A comparison of thermal diffusivities measured by such a method in the plane direction and in the thickness direction shows that it is possible to efficiently disperse heat generated at heat spots inside a portable device or the like in a plane direction of the portable device or the like by causing the thermal diffusivity measured in the plane direction of the molded article to be two or more times higher than the thermal diffusivity measured in the thickness direction of the molded article. The diffusivity measured in the plane direction of the molded article is preferably 2.5 or more times, more preferably 3 or more times, still more preferably 4 or more times, and most preferably 5 or more times higher than the thermal diffusivity measured in the thickness direction of the molded article.

In order to cause better heat transmission from inside to outside of a portable device or the like, where the heat is generated, it is necessary to have a high absolute value itself of the thermal diffusivity of the molded article. It is necessary that the thermal diffusivity measured in the plane direction of the molded article be not less than 0.5 mm$^2$/sec. The thermal diffusivity measured in the plane direction of the molded article is preferably not less than 0.75 mm$^2$/sec, more preferably not less than 1.0 mm$^2$/sec, still more preferably not less than 1.5 mm$^2$/sec, and most preferably not less than 2.0 mm$^2$/sec.

The highly thermally conductive resin molded article of the present invention, which can be both highly thermally conductive and electrically insulative, is particularly useful for an application in which a high thermal conductivity has been required but no metal has been usable because an electric insulation property is required. It is necessary that the highly thermally conductive resin molded article measured in conformity with ASTM D-257 have a volume resistivity of not less than $10^{10}$ Ω·cm. The volume resistivity is preferably not less than $10^{11}$ Ω·cm, more preferably not less than $10^{12}$ Ω·cm, still more preferably not less than $10^{13}$ Ω·cm, and most preferably not less than $10^{14}$ Ω·cm.

It is possible to mold a molded article which has such a thickness by various thermoplastic resin molding methods such as injection molding, extrusion molding, press molding, and blow molding. A molded article molded by an injection molding method is preferable because the injection molding method (i) can easily provide the molded article with a thermal diffusion anisotropy due to a high speed at which a resin composition is sheared during molding, (ii) is efficient in productivity due to its short molding cycle, and (iii) the like. The injection molding method is a molding method in which an injection molding machine is equipped with a mold, a resin composition which has been melted is injected into the mold at a high speed by the injection molding method, and the resin composition is cooled to be solidified, thereby obtaining a molded article. The molding machine and the mold which are used in this case are not particularly limited. It is preferable to use a mold which is designed so that a resulting molded article has a thickness of not more than 1.3 mm in a part or all over a three-dimensional shape of the resulting molded article. A ratio of a part of the molded article which part has a thickness of not more than 1.3 mm to the other part of the molded article can be appropriately set. A mold is preferable which is designed so that preferably not less than 50%, more preferably not less than 55%, still more preferably not less than 60%, and most preferably not less than 70% of the resulting molded article has a thickness of not more than 1.3 mm.

It is possible to extensively use the molded article thus obtained, in various forms such as a resin film, a resin sheet, and a resin molded article, for various applications such as an electronic material, a magnetic material, a catalytic material, a structure material, an optical material, a medical material, an automotive material, an architectural material. Since a general plastic injection molding machine which has been extensively used is usable for the highly thermally conductive thermoplastic resin molded article obtained in the present invention, it is also possible to obtain a molded article which has a complicated shape. Particularly because the highly thermally conductive thermoplastic resin molded article of the present invention has excellent properties of both remarkable molding workability and a high thermal conductivity, it is extremely useful as a resin for housings of a mobile phone, a display device, and a computer in each of which a heat source is provided.

The highly thermally conductive resin molded article of the present invention is preferably usable for injection molded articles of electric appliances, OA equipment parts, AV equipment parts, automotive exterior and interior parts, and the like. The highly thermally conductive resin molded article of the present invention is particularly preferably usable as an exterior material in electric appliances and OA equipment in each of which a large amount of heat is generated.

Further, in an electronic device in which a heating source is provided but it is difficult to cause a fan or the like to carry out forced cooling, the highly thermally conductive resin molded article of the present invention is preferably usable as an exterior material so that heat generated inside the electronic device is radiated to outside the electronic device. In particular, the highly thermally conductive resin molded article of the present invention is extremely useful as a resin for cases, housings, or external materials preferably of a portable computer such as a laptop personal computer and small-sized or portable electronic devices such as a PDA, a mobile phone, a portable game machine, a portable music player, a portable TV/video device, and a portable video camera. Note that the highly thermally conductive resin molded article of the present invention is also extremely useful as a resin for battery peripheral equipment of an automobile and an electric train, a resin for portable batteries of electric appliances, a resin for power distribution parts such as a breaker, a sealing material for a motor, and the like.

The highly thermally conductive resin molded article of the present invention is more excellent in shock resistance and surface property as compared to a conventionally known molded article, and has properties useful as parts or housings for the foregoing applications.

EXAMPLES

The following description more specifically discusses a composition and a molded article thereof according to the present invention with reference to Examples. The present invention is not limited only to the Examples.

Production Example 1:

53 parts by weight of orthoboric acid, 43 parts by weight of melamine, and 4 parts by weight of lithium nitrate were mixed in Henschel Mixer. Thereafter, 200 parts by weight of pure water was added to the mixture. The mixture was stirred at 80° C. for 8 hours and then filtrated to obtain a filtrate, which was then dried at 150° C. for 1 hour. The resulting compound was heated in an atmosphere of nitrogen at 900° C. for 1 hour. Further, the compound was sintered for crystallization in an atmosphere of nitrogen at 1800° C. The resulting sintered matter was grinded, thereby to obtain plate-like hexagonal boron nitride powder (BN-1). The resulting powder had a number average particle size of 48 μm, a ratio of agglomerated particles to the resulting powder (an agglomerated particle ratio) of 6.1%, and a tap density of 0.77 g/cm$^3$. When being caked alone, this powder had a thermal conductivity of 300 W/mK and was electrically insulative.

Production Example 2:

50 parts by weight of orthoboric acid, 40 parts by weight of melamine, and 10 parts by weight of calcium carbonate were mixed in Henschel Mixer. Thereafter, 200 parts by weight of pure water was added to the mixture. The mixture was stirred at 80° C. for 8 hours and then filtrated to obtain a filtrate, which was then dried at 150° C. for 1 hour. The resulting compound was heated in an atmosphere of nitrogen at 900° C. for 1 hour. Further, the compound was sintered for crystallization in an atmosphere of nitrogen at 2000° C. The resulting sintered matter was grinded, washed by use of a nitric acid aqueous solution so that the calcium carbonate component was removed, and then dried at 150° C., thereby to obtain plate-like hexagonal boron nitride powder (BN-2). The resulting powder had a number average particle size of 19 μm, a ratio of agglomerated particles to the resulting powder of 7.5%, and a tap density of 0.88 g/cm$^3$. When being caked alone, this powder had a thermal conductivity of 100 W/mK and was electrically insulative.

Production Example 3:

900 g of a polyether compound (I) (a bisphenol A ethylene oxide addition polymer which has an average molecular weight of 1000) and 10 g of a phenolic stabilizer AO-60 (produced by ADEKA Corporation) were placed in a pressure-resistant vessel (volume: 7 liters, produced by Taiatsu Techno Corporation) provided with a distillation tube and a stirrer, and the temperature was raised to 200° C. with stirring in nitrogen gas stream. Thereafter, 2100 g of polyethylene terephthalate resin (BELLPET EFG-70, produced by Bell Polyester Products, Inc.) was added at once. Then, the temperature was raised to 285° C. with stirring so that the mixture is melt and mixed. After the temperature reached 285° C., pressure inside the vessel was reduced to a pressure of not more than 1 torr. After that, stirring was carried out under the reduced pressure for 3 hours. Thereafter, the reaction was finished, thereby obtaining a block copolymer (CB-1) which (i) was composed of a polyethylene terephthalate segment and a bisphenol A ethylene oxide addition polymer segment and (ii) had a logarithmic viscosity of 0.81. Note that the logarithmic viscosity was measured by use of a mixed solvent of phenol/1,1,2,2-tetrachloroethane (weight ratio: 1/1) at a concentration of 0.25 g/dl at 25° C.

(Example 1)

Raw material 1 was prepared by mixing 0.2 part by weight of a phenolic stabilizer AO-60 (produced by ADEKA Corporation) with 100 parts by weight of polyethylene terephthalate resin (BELLPET EFG-70, produced by Bell Polyester Products, Inc.). Separately, Raw material 2 was prepared by mixing, in Superfloater, (i) 100 parts by weight of the plate-like hexagonal boron nitride powder (BN-1), (ii) 1 part by weight of epoxy silane (KBM-303, produced by Shin-Etsu Chemical Co., Ltd.), and (iii) 5 parts by weight of ethanol, stirring the mixture for 5 minutes, thereafter drying the mixture at 80° C. for 4 hours. Raw material 1 and Raw material 2 were set in separate weight type feeders and mixed so that a (A)/(B) volume ratio was 50/50. Thereafter, the mixture was poured through a hopper provided in the vicinity of the base of a screw of an intermeshing corotating twin-screw extruder TEX44XCT (produced by The Japan Steel Works, LTD.). The temperature was set to 250° C. in the vicinity of a feed opening, and was gradually increased to 280° C. at the tip of the screw of the extruder. In this way, a pellet was obtained as a sample to be injected. The pellet thus obtained was dried at 140° C. for 4 hours. Thereafter, a flat plate-like test piece of 150 mm×80 mm×0.8 mm (thickness) and a flat plate-like test piece of 50 mm×80 mm×1.1 mm (thickness) were molded by using an injection molding machine of 75 t through a pin gate provided in a surface center part of a flat plate in a gate size of Φ 0.8 mm. Then, a highly thermally conductive resin molded article which has a thermal conduction anisotropy was obtained.

(Examples 2 Through 10, Comparative Examples 1 Through 8)

Molded articles were obtained similarly to Example 1, except that kinds and amounts of blended raw materials were changed. The following are raw materials used in the Examples and Comparative Examples.

Other Inorganic Compounds (BN-3): Plate-like hexagonal boron nitride powder (GP, produced by DENKI KAGAKU KOGYO KABUSHIKI KAISHA; a thermal conductivity in pure form: 60 W/m·K; a number average particle size: 8.0 μm; electrically insulative, a volume resistivity: $10^{14}$ Ω·cm; an agglomerated particle ratio: 7.5%; a tap density: 0.50 g/cm$^3$)

(BN-4): Hexagonal boron nitride powder subjected to an agglomeration treatment with respect to plate-like hexagonal boron nitride powder (NW150, produced by National Nitride Technologies Co., Ltd.; a thermal conductivity in pure form: 60 W/m·K; a number average particle size: 150 μm; electrically insulative; a volume resistivity: $10^{14}$ Ω·cm; an agglomerated particle ratio: 100%; a tap density: 0.80 g/cm$^3$)

(BN-5): Turbostratic boron nitride powder (produced by Ying kou peng da precision chemical Ltd.; a thermal conductivity in pure form: 25 W/m·K; a number average particle size: 0.80 μm; electrically insulative; a volume resistivity: $10^{16}$ Ω·cm; an agglomerated particle ratio: 16%; a tap density: 0.20 g/cm$^3$)

(FIL-1): Spheric alumina powder (DAW-03, produced by DENKI KAGAKU KOGYO KABUSHIKI KAISHA; a thermal conductivity in pure form: 35 W/m·K; a number average particle size: 3 μm; electrically insulative; a volume resistivity: $10^{16}$ Ω·cm)

(FIL-2): Glass fiber (T187H/PL, produced by Nippon Electric Glass Co., Ltd.; a thermal conductivity in pure form: 1.0 W/m·K; a fiber diameter: 13 μm; a number average fiber length: 3.0 mm; electrically insulative; a volume resistivity: $10^{15}$ Ω·cm)

(FIL-3): Natural plate-like graphite powder (BF-50A, produced by Chuetsu Graphite Works Co., Ltd.; a thermal conductivity in pure form: 250 W/m·K; a number average particle size: 53 μm; electroconductive; an agglomerated particle ratio: 6.5%; a tap density: 0.64 g/cm$^3$)

A thermoplastic polyester resin and/or a thermoplastic polyamide resin (A):

(PES-1): Polyethylene terephthalate resin (BELLPET EFG-70, produced by Bell Polyester Products, Inc.)

(PES-2): Polybutylene terephthalate resin (NOVADURAN 5009L, produced by Mitsubishi Engineering Plastics Corporation)

(PA-1): Nylon 6 resin (UNITIKA Nylon 6 A1020BRL, produced by UNITIKA LTD.)

(PA-2): Nylon 9T resin (Genester N1000A, produced by KURARAY CO., LTD.)

Other resins:

(PC-1): Polycarbonate resin (TARFLON A2200, produced by Idemitsu Kosan Co., Ltd.)

(Other Blended Substances)

(FR-1): An aromatic condensed phosphate ester type flame retarder (PX-200, produced by DAIHACHI CHEMICAL INDUSTRY CO., LTD.)

[Thermal Diffusivity]

The resulting molded articles which have respective thicknesses of 0.8 mm and 1.1 mm were cut out, so that disk-shaped samples of D 12.7 mm were prepared. A laser light absorbing spray (Blackguard spray FC-153, produced by Fine Chemical Japan Co., LTD.) was applied to surfaces of the samples, and the samples were dried. Thereafter, thermal diffusivities of the respective samples were measured in thickness and plane directions of the respective samples by use of an Xe flash analyzer LFA447 Nanoflash (produced by Netzsch Inc.).

[Electric Insulation Property]

Volume resistivities were measured in conformity with ASTM D-257 by use of a flat plate. In a case where a measured value is not more than $10^3$ Ω·cm, "EC" (abbreviation of "ELECTROCONDUCTIVE") is shown in Table 1.

[Agglomerated Particle Ratio]

The flat plate was burned in an air atmosphere in an electric furnace at 650° C. for 30 minutes, thereby to remove the resin component by combustion. An agglomerated particle ratio was found photographically by observing at least 200 pieces of the plate-like hexagonal boron nitride powder (B) by use of a scanning electron microscope.

Table 1 shows blends and results thereof. According to Table 1, a composition within the scope of the present invention makes it possible to obtain a resin composition which is more excellent in liquidity in molding and has a higher thermal conductivity, as compared to a composition beyond the scope of the present invention. Note that, in a case where a blend could not be measured because it was difficult to subject the blend to a molding process, "UN" (abbreviation of "UNMEASURABLE") is shown in the table.

TABLE 1

| | Number/ Unit | Examples | | | | | | | | | |
|---|---|---|---|---|---|---|---|---|---|---|---|
| | | 1 | 2 | 3 | 4 | 5 | 6 | 7 | 8 | 9 | 10 |
| Thermoplastic resin (A) | PES-1 | 55 | 55 | 75 | 20 | | | | 50 | 50 | 45 |
| | PES-2 | | | | | 55 | | | | | |
| | PA-1 | | | | | | 55 | | | | |
| | PA-2 | | | | | | | 55 | | | |
| | CB-1 | | | | 20 | | | | | | |
| Other thermoplastic resins | PC-1 | | | | | | | | | | |
| Plate-like hexagonal boron nitride powder (B) | BN-1 | 45 | | 25 | 60 | 45 | 45 | 45 | | 40 | 45 |
| | BN-2 | | 45 | | | | | | 25 | | |
| Other inorganic compounds | BN-3 | | | | | | | | | | |
| | BN-4 | | | | | | | | | | |
| | BN-5 | | | | | | | | | | |
| | FIL-1 | | | | | | | | 25 | | |
| | FIL-2 | | | | | | | | | | 10 |
| | FIL-3 | | | | | | | | | | |

TABLE 1-continued

| | | | | | | | | | | |
|---|---|---|---|---|---|---|---|---|---|---|
| Other blended substances | FR-1 | | | | | | | | | 10 |
| 0.8 mm thermal diffusivity in plane direction | mm²/sec | 4.59 | 3.53 | 2.34 | 5.96 | 4.55 | 4.38 | 3.98 | 1.93 | 4.24 | 4.51 |
| 0.8 mm thermal diffusivity in thickness direction | mm²/sec | 0.74 | 0.70 | 0.44 | 0.90 | 0.78 | 0.72 | 0.78 | 0.72 | 0.77 | 0.73 |
| 0.8 mm thermal diffusion anisotropy | ratio | 6.2 | 5.0 | 5.3 | 6.6 | 5.8 | 6.1 | 5.1 | 2.7 | 5.5 | 6.2 |
| 1.1 mm thermal diffusivity in plane direction | mm²/sec | 4.39 | 3.21 | 2.05 | 5.79 | 4.25 | 3.88 | 3.78 | 1.53 | 3.44 | 4.44 |
| 1.1 mm thermal diffusivity in thickness direction | mm²/sec | 0.92 | 0.80 | 0.51 | 1.32 | 0.88 | 0.79 | 0.87 | 0.76 | 0.82 | 0.91 |
| 1.1 mm thermal diffusion anisotropy | ratio | 4.8 | 4.0 | 4.0 | 4.4 | 4.8 | 4.9 | 4.3 | 2.0 | 4.2 | 4.9 |
| Electric insulation property | Ω·cm | $10^{15}$ | $10^{15}$ | $10^{15}$ | $10^{15}$ | $10^{15}$ | $10^{15}$ | $10^{15}$ | $10^{16}$ | $10^{15}$ | $10^{15}$ |

| | Number/ Unit | Comparative Examples | | | | | | | |
|---|---|---|---|---|---|---|---|---|---|
| | | 1 | 2 | 3 | 4 | 5 | 6 | 7 | 8 |
| Thermoplastic resin (A) | PES-1 | 100 | 20 | 55 | 55 | 55 | 40 | 55 | |
| | PES-2 | | | | | | | | |
| | PA-1 | | | | | | | | |
| | PA-2 | | | | | | | | |
| | CB-1 | | | | | | | | |
| Other thermoplastic resins | PC-1 | | | | | | | | 55 |
| Plate-like hexagonal boron nitride powder (B) | BN-1 | | | | | | | | 45 |
| | BN-2 | | | | | | | | |
| Other inorganic compounds | BN-3 | | 80 | 45 | | | | | |
| | BN-4 | | | | 45 | | | | |
| | BN-5 | | | | | 45 | | | |
| | FIL-1 | | | | | | 60 | | |
| | FIL-2 | | | | | | | | |
| | FIL-3 | | | | | | | 45 | |
| Other blended substances | FR-1 | | | | | | | | |
| 0.8 mm thermal diffusivity in plane direction | mm²/sec | 0.09 | UN | 2.45 | 1.92 | 0.79 | 0.91 | 6.61 | UN |
| 0.8 mm thermal diffusivity in thickness direction | mm²/sec | 0.08 | UN | 1.11 | 1.63 | 0.74 | 0.93 | 1.15 | UN |
| 0.8 mm thermal diffusion anisotropy | ratio | 1.1 | — | 2.2 | 1.2 | 1.1 | 1.0 | 5.7 | — |
| 1.1 mm thermal diffusivity in plane direction | mm²/sec | 0.09 | UN | 2.35 | 1.90 | 0.77 | 0.89 | 6.40 | UN |
| 1.1 mm thermal diffusivity in thickness direction | mm²/sec | 0.08 | UN | 1.21 | 1.67 | 0.75 | 0.94 | 1.45 | UN |
| 1.1 mm thermal diffusion anisotropy | ratio | 1.1 | — | 1.9 | 1.1 | 1.0 | 0.9 | 4.4 | — |
| Electric insulation property | Ω·cm | $10^{16}$ | UN | $10^{15}$ | $10^{15}$ | $10^{15}$ | $10^{16}$ | EC | UN |

Unit of blending ratio: % by volume
Abbreviation:
UN stands for UNMEASURABLE
EC stands for ELECTROCONDUCTIVE (Comparative Example 9)

A test piece of 6.4 mm (thickness)×Φ 12.8 mm was molded through a gate having a gate size of Φ 2 mm in a transverse direction of a molded article by use of a composition in which a blend is similar to that of Example 1. One surface of the resulting molded article was uniformly grinded so that the molded article had a thickness of 0.8 mm. Then, a measurement was carried out similarly to Example 1. As a result, the molded article had a thermal diffusivity in a plane direction of 2.85 mm²/sec, a thermal diffusivity in a thickness direction of 2.03 mm²/sec, and a thermal diffusion anisotropy of 1.40. Therefore, the molded article was beyond the scope of the present invention.

FIG. 1 is an SEM photograph of a section of a molded article of Example 9. The photograph shows that plate-like hexagonal boron nitride powder is highly oriented in a plane direction of the molded article.

As described earlier, since a thermoplastic resin molded article of the present invention has excellent properties such as a high thermal conductivity, an electric insulation property, a low density, and a favorable injection moldability, it is industrially easily possible to obtain a molded article having a thermal conduction anisotropy in which the molded article is highly thermally conductive in its plane direction while being rather poorly thermally conductive in its thickness direction in a case where injection molding is carried out with respect to an exterior material of, for example, a portable electronic device. Such a molded article, which is usable as a heat-resistant material for various applications such as electric and electronic industries and an automotive field, is industrially useful.

The invention claimed is:
1. A highly thermally conductive resin molded article having a thermal diffusion anisotropy,
the highly thermally conductive resin molded article comprising a resin composition,
the resin composition containing at least resin (A) and plate-like hexagonal boron nitride powder (B) in a (A)/(B) volume ratio falling within a range of 90/10 to 30/70, wherein the resin (A) includes a thermoplastic polyester resin and/or a thermoplastic polyamide resin, and wherein the plate-like hexagonal boron nitride powder (B) includes agglomerated particles in a ratio of not more than 15%, the agglomerated particles being constituted by an agglomeration of a plurality of plate-like particles,
the highly thermally conductive resin molded article having a thickness of not more than 1.3mm in a part of or all over a three-dimensional shape of the highly thermally conductive resin molded article,
a thermal diffusivity measured in a plane direction of the highly thermally conductive resin molded article, being (i) two or more times higher than a thermal diffusivity measured in a thickness direction of the highly thermally conductive resin molded article and (ii) not less than 0.5mm$^2$/sec, the highly thermally conductive resin molded article having a volume resistivity of not less than $10^{10}$ Ω·cm.

2. The highly thermally conductive resin molded article as set forth in claim 1, wherein the highly thermally conductive resin molded article is molded by an injection molding method.

3. The highly thermally conductive resin molded article as set forth in claim 1, wherein the plate-like hexagonal boron nitride powder (B) has a number average particle size of not less than 30μm.

4. The highly thermally conductive resin molded article as set forth in claim 1, wherein the plate-like hexagonal boron nitride powder (B) has a tap density of not less than 0.6g/cm$^3$.

5. The highly thermally conductive resin molded article as set forth in claim 1, wherein the thermal diffusivity measured in the plane direction of the highly thermally conductive resin molded article, being (i) four or more times higher than the thermal diffusivity measured in the thickness direction of the highly thermally conductive resin molded article.

* * * * *